(12) United States Patent
Hadfield

(10) Patent No.: US 7,619,201 B2
(45) Date of Patent: Nov. 17, 2009

(54) MULTIPLICATION REGISTER FOR AMPLIFYING SIGNAL CHARGE

(75) Inventor: Kevin Anthony Derek Hadfield, Chelmsford (GB)

(73) Assignee: E2V Technologies (UK) Limited, Chelmsford, Essex (GB)

( * ) Notice: Subject to any disclaimer, the term of this patent is extended or adjusted under 35 U.S.C. 154(b) by 0 days.

(21) Appl. No.: 11/547,215

(22) PCT Filed: Apr. 7, 2005

(86) PCT No.: PCT/GB2005/001354

§ 371 (c)(1),
(2), (4) Date: Sep. 24, 2007

(87) PCT Pub. No.: WO2005/098957

PCT Pub. Date: Oct. 20, 2005

(65) Prior Publication Data

US 2008/0137801 A1    Jun. 12, 2008

(30) Foreign Application Priority Data

Apr. 7, 2004    (GB) ................................. 0407926.5

(51) Int. Cl.
*H01L 31/00* (2006.01)
*G11C 19/28* (2006.01)
*H04N 3/14* (2006.01)

(52) U.S. Cl. ...................... 250/214.1; 377/57; 348/311; 257/223

(58) Field of Classification Search ............... 250/208.1, 250/214.1; 348/311, 324, 282, 283; 257/223, 257/224, E27.15, E27.151, E27.152
See application file for complete search history.

(56) References Cited

U.S. PATENT DOCUMENTS 4,055,836 A * 10/1977 Weimer ...................... 365/183
4,392,154 A     7/1983 Horii et al.

(Continued)

FOREIGN PATENT DOCUMENTS

GB    2 348 070 A    9/2000

OTHER PUBLICATIONS

International Search Report issued in PCT/GB2005/001354 dated Apr. 4, 2005.
Jaroslav Hynecek (1992) "CCM-A New Low-Noise Charge Carrier Multiplier Suitable for Detection of Charge in Small Pixel CCD Image Sensors" IEEE Transactions on Electron Devices. vol. 39, No. 8 1972-1975, Aug. 1992.

(Continued)

*Primary Examiner*—Thanh X Luu
(74) *Attorney, Agent, or Firm*—Venable LLP; Robert Kinberg; Robert S. Babayi

(57) ABSTRACT

A multiplication register for use in solid state imaging apparatus, such as a CCD, is described. The multiplication register has a gain element 22 comprising a plurality of register electrodes 30, 32, 34, and 36, for transferring charge along a change transfer channel, and for amplifying the charge. Channel edge defining electrodes 24 and 26 are disposed either side of the channel 28, in place of channel stops, removing the effects of spurious charges generated in the channel in the regions of amplification. The provision of the channel edge defining electrodes 24 and 26 allows the resulting structure of the channel electrodes to be made simpler, and means that a structure can be provided for clocking and amplifying charge in either direction along the channel.

26 Claims, 7 Drawing Sheets

U.S. PATENT DOCUMENTS

| | | | | |
|---|---|---|---|---|
| 5,337,340 | A | * | 8/1994 | Hynecek ..................... 377/60 |
| 5,488,010 | A | | 1/1996 | Wong et al. |
| 6,278,142 | B1 | | 8/2001 | Hynecek |
| 6,444,968 | B1 | | 9/2002 | Burt et al. |
| 2002/0126213 | A1 | * | 9/2002 | Hynecek ..................... 348/241 |
| 2005/0029553 | A1 | * | 2/2005 | Hynecek ..................... 257/223 |

OTHER PUBLICATIONS

United Kingdom Search Report, dated Sep. 10, 2004, for counterpart British Application No. GB0407926.5.

* cited by examiner

MULTIPLICATION REGISTER FOR AMPLIFYING SIGNAL CHARGE

This invention relates to charge coupled devices (CCDs) and more particularly to a multiplication register for amplifying signal charge for a CCD.

In a typical CCD imager, signal charge representative of incident radiation is accumulated in an array of pixels in an image area. Following an integration period, the signal charge is transferred to an output register by applying appropriate clocking or drive pulses to control electrodes. The signal charge is then read out from the output register and applied to a charge detection circuit to produce a voltage which is representative of the amount of signal charge.

In a paper by Hynecek entitled "CCM-A New Low-Noise Charge Carrier Multiplier Suitable For Detection Of Charge In Small Pixel CCD Image Sensors" IEEE Trans. Of Electron Devices Vol. 39, No. 8, pp 1972-1975, August 1992, a proposal is made to multiply charge carriers within the CCD image area during the transfer process as signal charge is clocked from pixel to pixel to the output register. The suggested technique involves establishing large electric fields in the semiconductor material beneath pairs of control electrodes which in conventional operation are controlled to collect and move signal charge through the CCD elements. The required large fields may be obtained by using a large difference in drive voltages applied to adjacent CCD control electrodes during the transfer process. Signal charge carriers are thus accelerated to sufficiently high velocities by the large field regions that, on transfer between regions under the control electrodes, additional carriers are generated through impact ionisation. Although the charge multiplication per transfer is generally low, typically up to 1%, a usefully large signal gain may be achieved because of the large number of transfers normally required for signal readout in a practical device. As the additional noise associated with the multiplication process is low, the increased signal level gives an improvement in the overall signal-to-noise ratio of the detector. The concept of carrier multiplication is also known in other types of solid state detectors, such as avalanche photodiodes, for example.

One known means for amplifying the signal charge from an image is a multiplication register having one or more gain elements arranged in series. A single gain element of the multiplication register will now be described with reference to FIGS. 1 and 2. FIG. 1 shows the gain element in a longitudinal cross-sectional view, and FIG. 2 shows a gain element in a top elevation view.

The gain element 2 comprises a silicon wafer having a p-type silicon layer 4 and an n-type silicon layer 6. Four polysilicon electrodes 10, 12, 14 and 16 are formed on the silicon wafer and are isolated from the n-type silicon layer 6 by a dielectric layer 8, such as a layer of silicon oxide. Electrodes 10 and 16 are clock electrodes, electrode 12 is a DC electrode and electrode 14 is a high voltage electrode for providing amplification. These four electrodes shall be referred to collectively as drive electrodes for convenience. The width of the electrodes 10, 12, 14 and 16 shown in FIG. 1 is typically 5 µm, while the thickness of the dielectric layer is typically 129 nm.

A packet of electrons comprising part of an image signal is transferred through the gain element from left to right and is amplified by means of suitable waveforms applied to each of the electrodes. Clock electrodes 10 and 16 are periodically held at a positive potential thereby attracting electrons in the region of the n-type silicon layer 6 underneath them. Clock electrodes 10 and 16, and amplification electrode 14 move periodically between a high and a low potential. DC Electrode 12 however is held at a constant positive DC level slightly higher than the low clocked potential applied to clock electrodes 10 and 16. Before the high to low transition of the clock electrode 10, the potential of the amplification electrode 14 is made high. Signal electrons originally under electrode 10 therefore drift rightwards to the amplification electrode 14, where the potential on the electrode 14 is high enough to cause the signal electrons to collide with the silicon atoms in the n-type layer 6, dislodging more electrons and increasing the number of electrons in the packet. This process is known as impact ionisation and results in multiplication of the electron signal. The signal electrons and the electrons created by impact ionisation accumulate under the amplification electrode 14, and are then transferred to the rightmost clocked electrode 16 by making the potential on the amplification electrode 14 low and the potential on the clocked electrode 16 high. The charge packet, which is now larger than it was originally, is then passed into the next gain element by appropriate switching of the potentials on the clock electrodes 16 and 10'.

The voltage of the clock electrodes 10 and 16 is typically 10V when high and close to 0V, say 2V to 3V when low. The amplification electrode 14 is similarly held at a low value of around 2V to 3V, but typically has a high level of between 20V and 50V depending on the amount of gain that is required. The DC electrode 12 is also typically set at a voltage of between 2V and 3V.

By way of example, a multiplication register could comprise 591 gain elements; if the impact ionisation increases the signal by 1% in each gain element, the combined gain of the register of the CCD will be $1.01^{591}=358$.

The positive potential on the electrodes controls the longitudinal position of the packet of electrons in the direction of travel. However, it is also necessary to limit their movement in a transverse or lateral direction away from the electrodes, to prevent them from being attracted to other structures formed on the silicon wafer. In known multiplication registers, this is achieved by providing one or more implants in the silicon wafer, known as a channel stop. The channel stop provides a potential barrier at the side of the channel, acting as a wall to delineate the boundaries of the channel through which the electrons are transferred and amplified.

The electron potential across the channel is shown schematically by way of reference in FIG. 3, for the situation in which the potential on a clocking electrode is both low and high. It will be appreciated that increasing positive potential is shown on the negative axis.

The channel stops ensure that the potential adjacent the channel is at approximately 0V, thereby screening the channel from the electric potentials of say adjacent channels, or other structures on the wafer. Thus, signal charge is retained in the channel.

It was recognised during the development of Low Light Level (LLL) CCDs that the amplification electrode 14 supplied with the large amplitude waveform should not extend over the silicon wafer close to the sides of the channel. If it did so, the high electric field of the amplification electrode caused the release of significant numbers of electrons unrelated to the packet of signal electrons. Such electrons form what is commonly known as "dark current" because they are not related to light falling on the CCD image area. The mechanism of this kind of "dark current" is not well understood, but is believed to result from the high field strength produced by the amplification electrode over the channel stop freeing electrons from the silicon lattice. Other kinds of dark current for example are known to be attributed to thermal noise in the silicon lattice of the wafer.

The gain process in the gain element applies equally to the dark current electrons as well as the signal electrons. As a result the dark current can swamp the required signal, which in the case of LLL CCDs can be small.

As a result, a LLL CCD multiplication register, developed by the applicant, has a DC electrode specially shaped to minimise the generation of spurious charge and the resulting dark current. This can be seen in more detail in FIG. 2 in a top elevation view. The drive electrodes 10, 12, 14 and 16 are mounted substantially at right angles to a channel defined between two longitudinally extending channel stops 18 and 20. The channel stops are formed of a heavily doped p-type material located under the dielectric layer 8.

As can be seen from FIG. 2, the electrodes all have a generally rectangular shape, except for the DC electrode which has a cut-out section, giving it a horseshoe or C shape. The two parallel opposing sections of the horseshoe or C shape extend along the charge transfer channel, adjacent the channel stops 18 and 20. The amplification electrode 14 is located above the DC electrode 12, so that it at least partly overlaps the cut-out section, but is insulated from the DC electrode by a further dielectric layer. The amplification electrode 14 is shown with a dotted line in FIG. 2 so as not to obscure the detail of the DC electrode 12 underneath.

This arrangement shields the regions of the channel next to the channel stops 18 and 20 from the high potential of the amplifying electrode 14. As a result, generation of spurious charge next to the channel-stops 18 and 20, and the amplification of this charge to give increased dark current, is avoided. A drawback with this arrangement however is that it is complicated to manufacture, because of the need to have a differently shaped DC electrode, and the amplification electrode placed above it. Also, the amplification effect of the electrode is only experienced in the centre of the channel, which means that the amplification of charge in the multiplication register is less uniform.

We have therefore appreciated that there is a need to provide an improved multiplication register that is easier to manufacture, and which avoids the associated problems mentioned above.

The invention is defined in the independent claims to which reference should now be made. Advantageous features are set forth in the dependent claims.

A preferred embodiment of the invention will now be described in more detail, by way of example, and with reference to the drawings in which.

Figure 1:
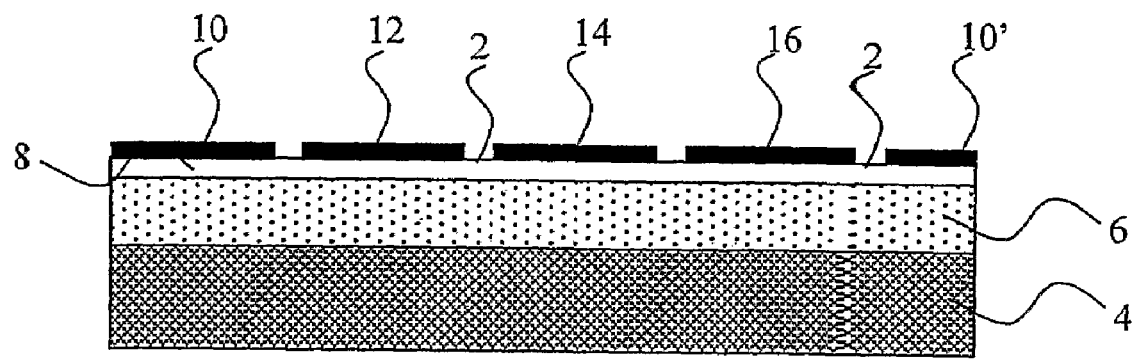
FIG. 1 is a longitudinal cross-sectional view through a gain element of a known multiplication register.
Figure 1:
Figure 4:
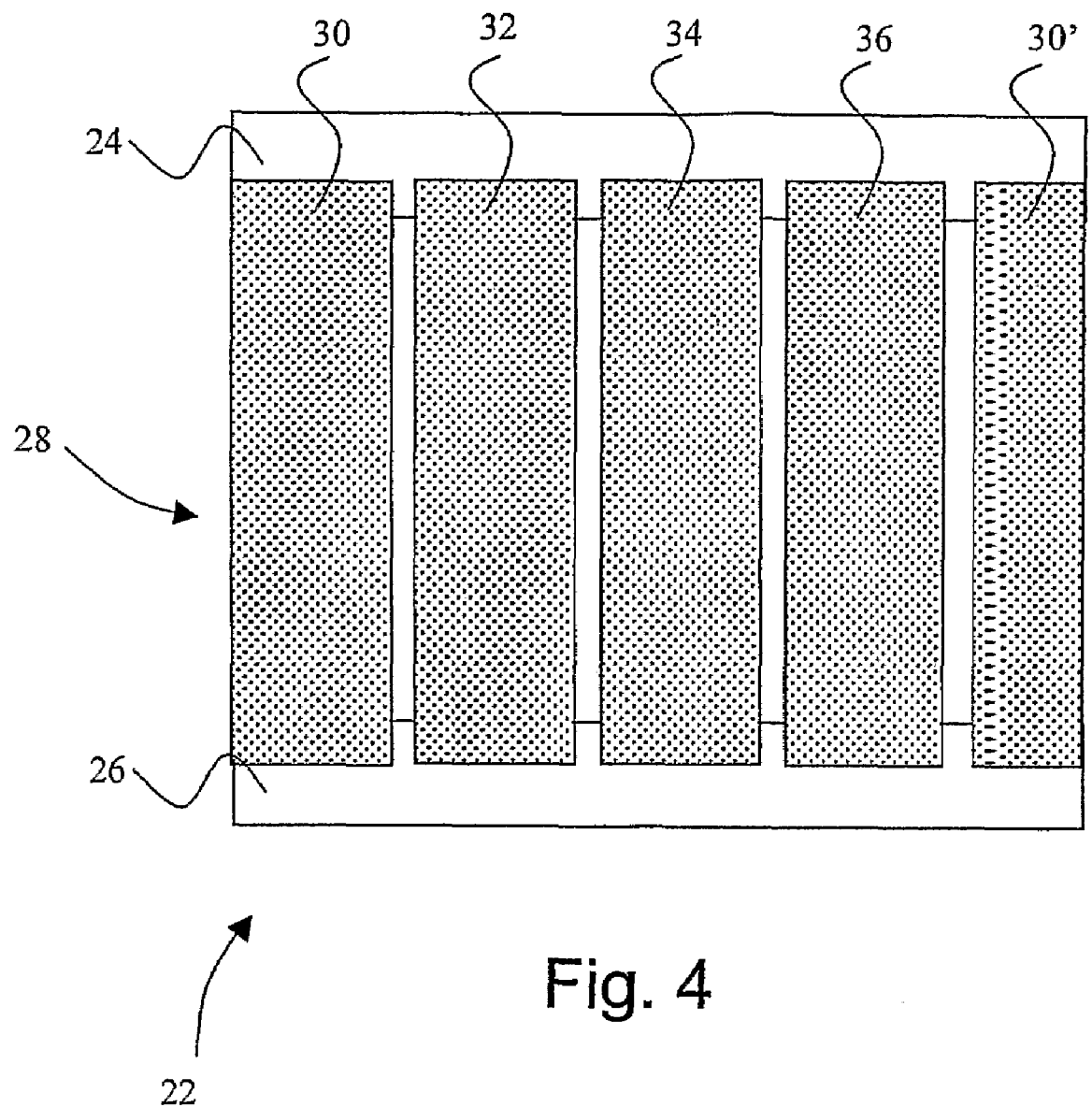
FIG. 4 is a top elevation view of the preferred embodiment of the invention.

FIG. 4 shows a gain element 22 in a preferred embodiment of a multiplication register. The gain element 22 comprises a silicon wafer (not shown) on which two straight, parallel opposing electrodes 24 and 26 are disposed, delineating between them a channel 28 for the passage of charge. Clock electrodes 30 and 36, DC electrode 32 and amplification electrode 34 are provided above the channel and adjacent to each other. These electrodes shall subsequently be referred to collectively as register electrodes. The application of suitable waveforms to the clock electrodes 30 and 36, and the amplification electrode 34, cause the signal charge to move along the channel from left to right under register electrodes 30, 32, 34 and 36, and to be amplified, in the same manner as described for FIG. 1. The preferred embodiment shown in FIG. 4 does not however comprise channel stops, as the function of the channel stops is performed by the channel edge defining electrodes 24 and 26.

The channel edge defining electrodes 24 and 26, which for convenience shall be referred to as barrier electrodes from now on, are preferably held at a potential of between −2V and 2V to 3V, assuming the typical waveforms applied to the clocked, DC and amplification electrodes described earlier. These electrodes therefore provide a potential barrier which acts to constrain the signal charge in the channel. This will be described in more detail later.

The provision of the channel edge defining electrodes has previously been considered undesirable as it increases the capacitance of the gain element in relation to the drive circuitry, and therefore requires more power during operation. However, we have appreciated that using channel edge defining electrodes in the manner described above results in improved operation, since by removing the channel stops from the vicinity of the amplification electrode, the generation of spurious charge and the resulting dark current can be avoided.

Figure 5:
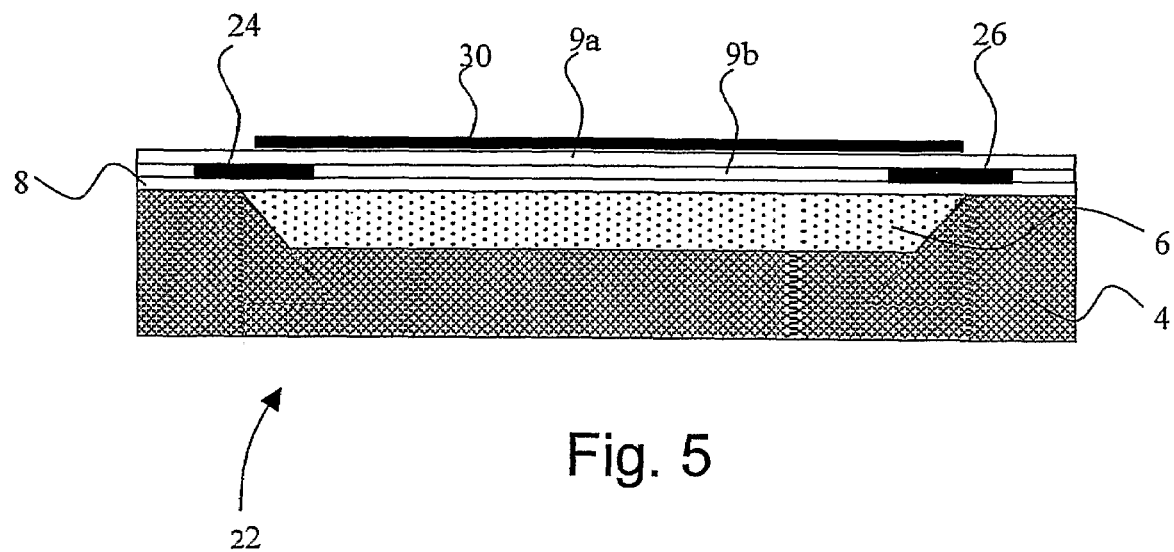
FIG. 5 is a transverse cross-sectional view of the embodiment shown in FIG. 3.

FIG. 5 shows the preferred gain element in a transverse cross-sectional view looking along the direction of the channel. n-type region 6 is shown contained within p-type layer 4. The barrier electrodes 24 and 26 defining the channel are mounted on the dielectric layer 8. Clock electrode 30 is mounted above the barrier electrodes 24 and 26 and is insulated from them by intervening additional layers of dielectric 9a and 9b. The polysilicon electrodes 30, 24 and 26 and the dielectric layers 8, 9a and 9b are formed by conventional deposition, sputtering or photo-lithography techniques for example.

As stated above, the barrier electrodes 24 and 26 are maintained at a slightly lower potential than the clocked, DC or amplification electrodes 30, 32, 34 and 36. As a result a potential barrier is created adjacent the channel. The barrier effectively screens the channel from outside potentials, such as those from electrodes in other channels or from other on-chip structures. As a result signal electrons only "see" the relative potential barrier between the potential on the clocked electrodes, and the barrier electrodes, thereby encouraging them to remain in the channel, and constraining them to the region underneath the drive electrodes.

The upper limit to the voltage that can be applied to the barrier electrodes is given by the voltage of the DC electrode which is typically 2V to 3V. If the barrier electrodes are more positive than this, there may be a point in time as one clock electrode becomes low, and the next becomes high, when the barrier electrode is more positive than either of the clock electrodes. Charge may then move under the barrier electrodes and communicate with charge from other multiplication elements.

The negative limit to the range of possible potentials on the barrier electrode stems from the resulting reduction in width of the channel, not unlike cutting off the channel in a MOS- FET transistor when the gate is made more negative. If the width of the channel decreases then the amount of charge which can be carried in the channel is also reduced limiting the maximum signal that the multiplication register can provide.

Figure 3:
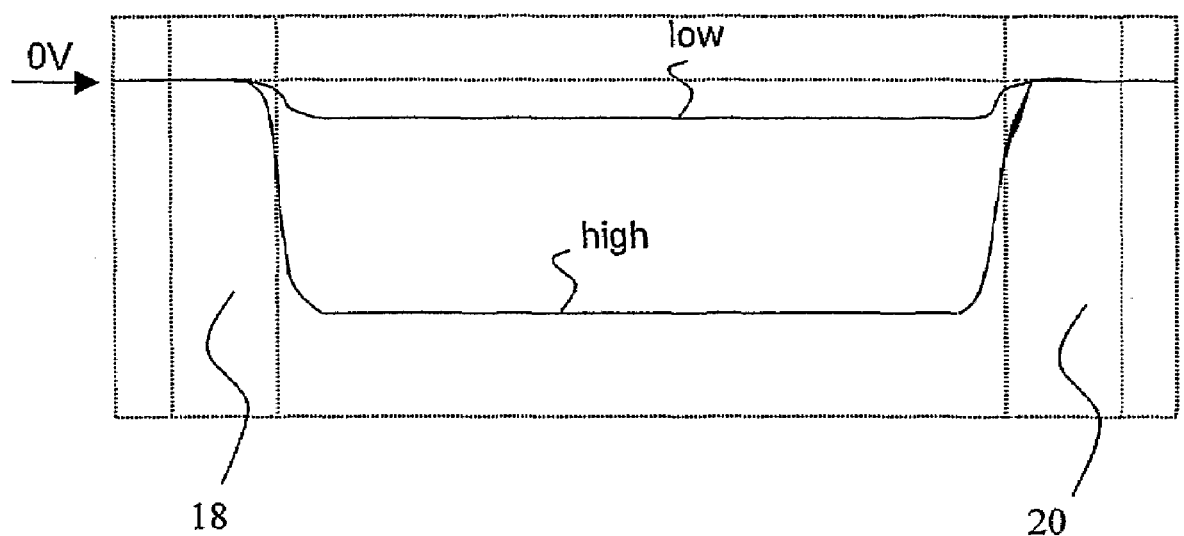
FIG. 3 is a schematic illustration of the electron potential across a known channel including channel stops.
Figure 6:
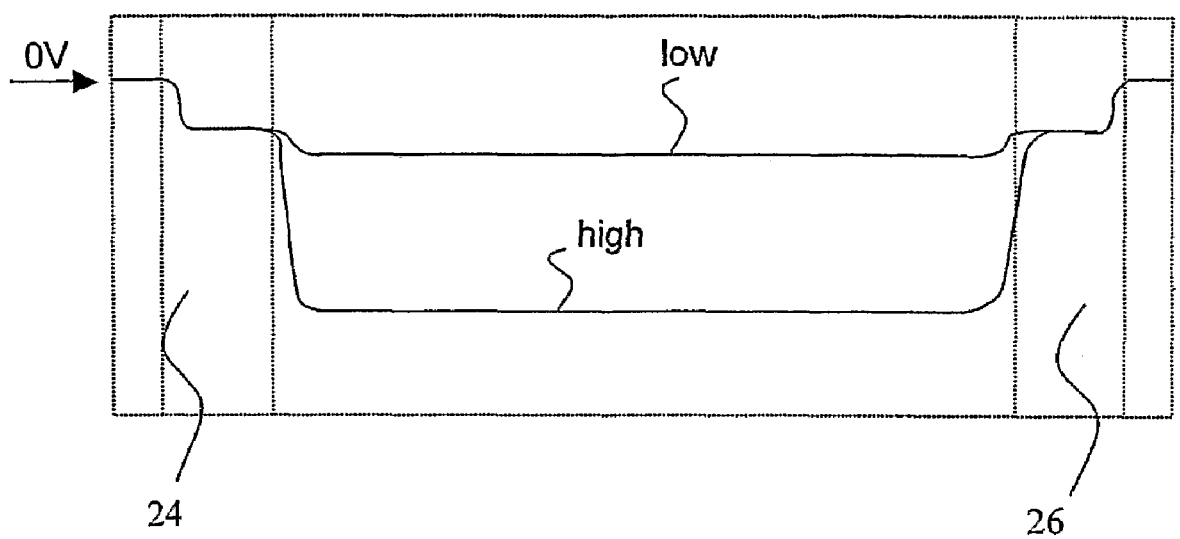
FIG. 6 is a chart illustrating the shape of the potential well resulting from the electrode arrangement in the preferred embodiment of FIGS. 4 and 5.

FIG. 6 schematically shows the potential across the width of the channel in the case where barrier electrodes 24 and 26 are present. Again, a positive potential is shown on the negative axis. In FIG. 6, the potential on the barrier electrodes is slightly positive in the order of 1V to 2V. This has the advantage of delimiting the edges of the channel, while providing a slightly broader channel width than the channel stops shown in FIG. 3 which provide a potential of approximately 0V.

In the applicant's International patent application No. WO02/058157, a multiplication register is described which operates in conjunction with an adjacently located overspill register. Excess charge building up in gain elements of the multiplication register which would cause saturation is transported to the overspill register where it continues in parallel with the charge packed from which it was originally extracted. A charge packet output from the multiplication register can be added to the corresponding charge packed output from the overspill register giving a final value for the charge unimpaired by saturation effects in the multiplication register.

Figure 7:
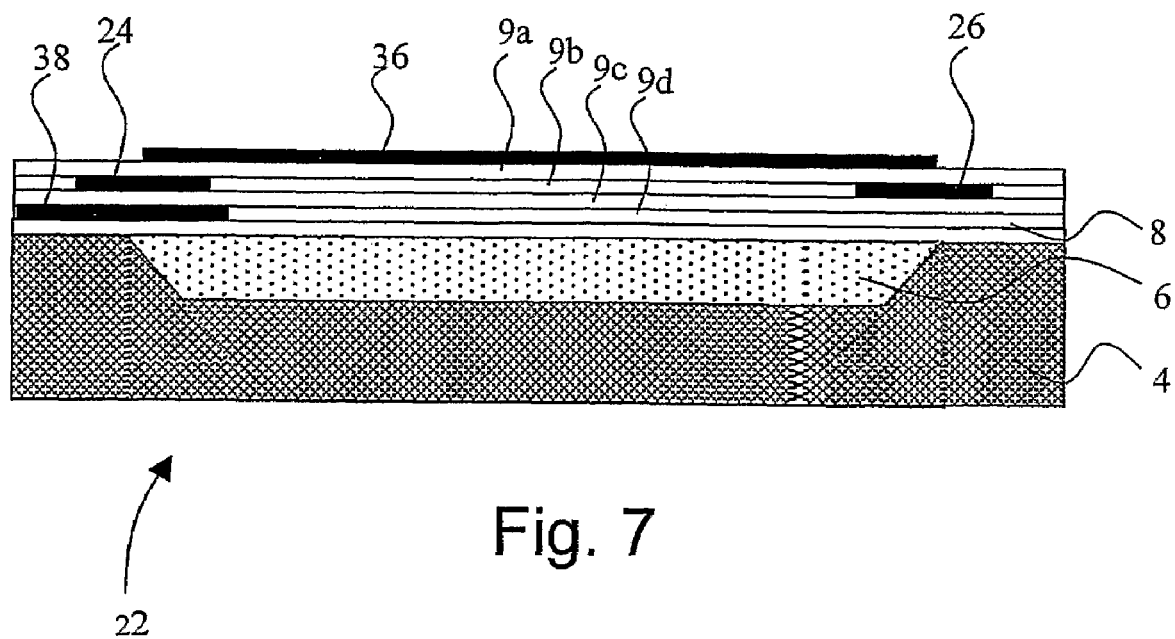
FIG. 7 is a transverse cross-sectional view of a second embodiment of the invention.

FIG. 7 shows a modification to the preferred gain element shown in FIGS. 4 and 5, for use with an overspill register. An additional clocked transport or overspill electrode 38 is located adjacent to the channel and extends further from it than the barrier electrode 24. Clocked transport electrode 38 is preferably formed on dielectric layer 8 underneath the barrier electrodes 24 and 26 and register electrodes 30, 32, 34 and 36. Preferably, the clocked transport electrode 38 is situated next to the clocked electrode 30, as this distances it from the amplification electrodes and associated high potentials that might affect its operation.

The clocked transport electrode 38, the barrier electrodes 24 and 26 and the register electrodes (in this case clocked electrode 36 is shown) are all insulated from each other by dielectric layers 9a, 9b, 9c and 9d.

In the embodiments described so far, the barrier electrodes have been presented as continuous electrodes that run the entire length of the channel on both sides of the register electrodes. However, as will be appreciated, the channel 28 could be defined by a continuous barrier electrode on one side, and a conventional channel stop on the other. In this configuration, the DC electrode 32 is provided with a cut-out making it L-shaped rather than the horseshoe or C shape shown in FIG. 2, so that it shields the effect of the amplification electrode near the channel stop.

Furthermore, although the barrier electrodes 24 and 26 have been described as straight and parallel, the barriers 24 and 26 may also curve, diverge or converge depending on the desired specifications. The final choice of the barrier geometry will merely depend on the nature of the desired channel.

It will also be appreciated from the foregoing, that in order to avoid the generation of spurious charges due to the amplification electrode, it is only necessary to provide the barrier electrodes 24 and 26 under the amplification electrode. A conventional channel stop can therefore still be provided adjacent to the clocked and DC electrodes, as in the known arrangement shown in FIG. 1. However, manufacture in this case can be difficult as the separate segments forming the barrier electrodes 24 and 26 all need to be connected to a similar potential, and the channel stop must be formed in the silicon wafer in isolated lengths rather than in a continuous length. As a result, it is preferred if the barrier electrodes 24 and 26 are formed as continuous lengths of polysilicon stretching the whole length of the channel, or at least the length of several gain elements as described.

Additionally, the barrier electrodes can be formed so that they are contiguous with the DC electrode 32. This arrangement simplifies the necessary electrical connections to the chip.

To sum up, in alternative embodiments, the barrier electrodes need not be continuous, and may alternate with regions of channel stop material located appropriately with regard to the amplification electrode 34, on the same or opposite sides of the channel.

The use of barrier electrodes 24 and 26 instead of channel stops, in the preferred embodiments discussed, provides a number of advantages in addition to the reduction of spurious charge. Firstly, as an amplification electrode 34 extending over the entire width of the channel can be used, the gain mechanism occurs more evenly across the channel giving the same gains for a lower peak voltage and reducing aging effects. Secondly, as the full width of the channel is available for use in charge amplification the on-chip area can be used more effectively. Omitting the shielded area under the amplification electrode means that for the same gain of the register, the channel can be made narrower, or the size of the amplification electrode can be reduced in the direction along the register. While the latter effect may only result in the pitch of the amplification elements being reduced by say 0.5 μm, this can add up to a valuable saving of space where there are several hundred multiplication elements and the design layout is tight. Furthermore, it reduces the extra capacitance added by laying the register electrodes over the barrier electrodes. In addition to the advantageous effects of the smaller device geometry, the simplified structure of the DC electrode 32 allows simplified allocation of the polysilicon layers used to form the electrodes 30, 32, 34 and 36 during manufacture. In particular, it is not necessary to decide at the design stage which of the electrodes will be the clocked, DC and amplification electrodes, as they are all substantially the same shape.

As will be appreciated from FIG. 4, if the drive electrodes are all the same shape, bi-directional clocking is possible in which signal electron packets can be clocked in either direction, with or without multiplication, merely by swapping or changing the waveforms applied to the electrodes. As a result, a charge packet can be made to pass backwards and forwards several times through the same array of gain elements, experiencing amplification each time it does so. Such an arrangement means that the same amount of gain can be achieved with fewer multiplication elements, allowing the design of the charge coupled device to be made simpler and more space efficient, and providing a design which requires less power to operate (fewer elements means a lower capacitance to drive and therefore less of a demand for power).

Rather than controlling the gain of a multiplication register by adjusting the voltage applied to the amplification electrode, therefore the gain could be controlled in a bi-directional device by causing a charge packet to pass backwards and forwards through the register a desired number of times, while holding the voltage on the amplification electrodes constant.

Bi-directional clocking also means that the gain of a multiplication register can be conveniently measured. This is achieved by introducing a known amount of charge at the output, clocking it backwards through the register with unity gain, and then clocking it forwards with a non-unity gain applied and measuring the output. This is particularly useful as it does not require a structure for injecting test charge to be present at the input end of the register.

Figure 2:
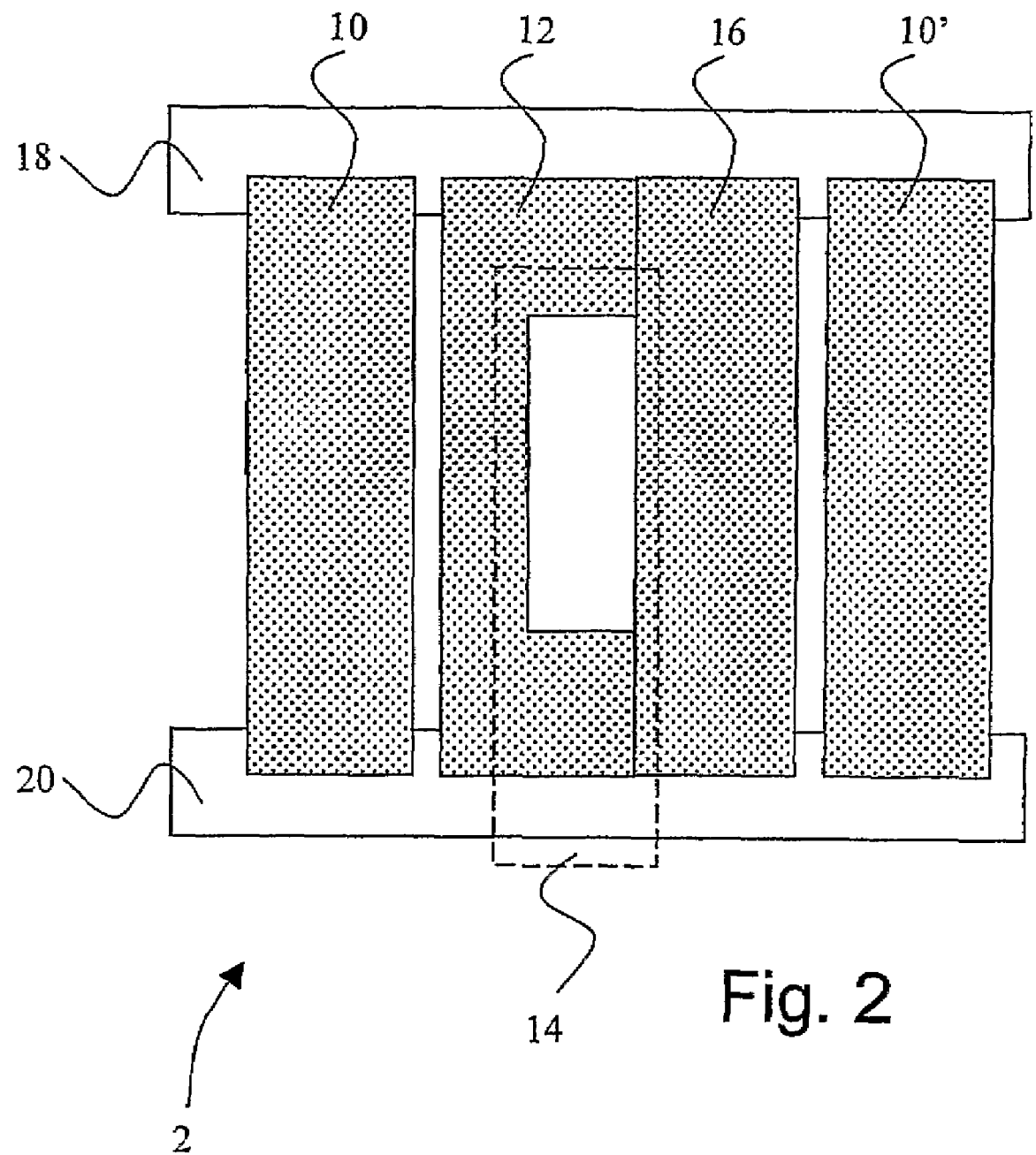
FIG. 2 shows a top elevation view of the electrode arrangement in a known gain element designed to reduce the effects of spurious charge amplification at the sides of the channel.

Bi-directional clocking cannot of course be achieved with the device shown in FIG. 2, as when charge packets are clocked in the opposite direction, the electrode that is required to be the dc electrode does not have the right shape to shield the effects of the amplification electrode.

The invention claimed is:

1. A multiplication register for amplifying signal charge, comprising:
   a substrate;
   a plurality of register electrodes, mounted on the substrate, for transferring signal charge along a charge transfer channel such that the signal charge is amplified; and
   at least one channel edge defining electrode, located adjacent one or more of the register electrodes for constraining the signal charge in the charge transfer channel, wherein the plurality of register electrodes comprises one or more amplification electrodes for amplifying the signal charge; and an overspill electrode disposed on the substrate under the channel edge defining electrode.

2. A multiplication register according to claim 1, comprising a channel edge defining electrode on one side of the charge transfer channel, and a channel stop on the opposite side.

3. A multiplication register according to claim 1, wherein the channel edge defining electrode is a continuous electrode running the length of the charge transfer channel.

4. A multiplication register according to claim 1 wherein the plurality of register electrodes comprises a dc electrode held at a constant potential, and at least one clock electrode receiving a clocked potential for controlling the transfer of the charge along the channel.

5. A multiplication register according to claim 1, wherein the channel edge defining electrodes define a curved path.

6. A multiplication register according to claim 1, wherein the channel edge defining electrodes define a diverging path, or a converging path.

7. A multiplication register according to claim 1, wherein the overspill electrode is disposed adjacent a clock electrode, preferably after the amplification electrode.

8. A solid state image sensing apparatus comprising the multiplication register of claim 1.

9. A multiplication register according to claim 1, wherein the at least one channel edge defining electrode is of such a length as to be located adjacent the one or more amplification electrodes.

10. A multiplication register according to claim 4, wherein the dc electrode, the clocked electrode and the amplification electrode have substantially identical shapes.

11. A multiplication register for amplifying signal charge, comprising:
   a substrate;
   a plurality of register electrodes, mounted on the substrate, for transferring signal charge along a charge transfer channel such that the signal charge is amplified; and
   at least one channel edge defining electrode located adjacent one or more of the register electrodes for constraining the signal charge in the charge transfer channel, wherein the plurality of register electrodes comprises one or more amplification electrodes for amplifying the signal charge, and wherein at least one channel edge defining electrode is of a length located adjacent the one or more amplification electrodes, and wherein channel edge defining electrodes are located on both sides of the charge transfer channel.

12. A multiplication register according to claim 11, wherein the at least one channel edge defining electrode is a continuous electrode running the length of the charge transfer channel.

13. A multiplication register according to claim 11, wherein the plurality of register electrodes comprises a dc electrode held at a constant potential, and at least one clock electrode receiving a clocked potential for controlling the transfer of the charge along the channel.

14. A multiplication register according to claim 11, having no channel stops.

15. A solid state image sensing apparatus comprising the multiplication register of claim 11.

16. A multiplication register for amplifying signal charge, comprising:
   a substrate;
   a plurality of register electrodes, mounted on the substrate, for transferring signal charge along a charge transfer channel such that the signal charge is amplified; and
   at least one channel edge defining electrode located adjacent one or more of the register electrodes for constraining the signal charge in the charge transfer channel, wherein the plurality of register electrodes comprises one or more amplification electrodes for amplifying the signal charge, and wherein at least one channel edge defining electrode is of a length located adjacent the one or more amplification electrodes, and wherein the plurality of register electrodes comprises a dc electrode held at a constant potential, and at least one clock electrode receiving a clocked potential for controlling the transfer of the charge along the channel, and wherein the dc electrode, the clock electrode and the amplification electrode have substantially identical shapes.

17. A multiplication register according to claim 16, wherein the channel edge defining electrodes are held at a potential between −2V and +3V.

18. A multiplication register according to claim 16, wherein the dc electrode and the at least one edge defining electrode are formed so that they are contiguous.

19. A multiplication register according to claim 16, wherein at least one channel edge defining electrode is located on one side of the charge transfer channel and at least one channel stop is located on the opposite side of the charge transfer channel.

20. A multiplication register according to claim 16, wherein at least one channel edge defining electrode is located on both sides of the charge transfer channel.

21. A multiplication register according to claim 16, wherein the at least one channel edge defining electrode is a continuous electrode running the length of the charge transfer channel.

22. A multiplication register according to claim 16, having no channel stops.

23. A solid state image sensing apparatus comprising the multiplication register of claim 16.

24. A multiplication register for amplifying signal charge, comprising:
   a substrate;
   a plurality of register electrodes, mounted on the substrate, for transferring signal charge along a charge transfer channel such that the signal charge is amplified; and
   at least one channel edge defining electrode located adjacent one or more of the register electrodes for constraining the signal charge in the charge transfer channel, wherein the plurality of register electrodes comprises one or more amplification electrodes for amplifying the signal charge, and wherein at least one channel edge defining electrode is of a length located adjacent the one or more amplification electrodes, and having no channel stops.

25. A multiplication register according to claim 24, wherein the at least one channel edge defining electrode is a continuous electrode running the length of the charge transfer channel.

26. A multiplication register according to claim 24, wherein the plurality of register electrodes comprises a dc electrode held at a constant potential, and at least one clock electrode receiving a clocked potential for controlling the transfer of the charge along the channel.

* * * * *